US008779860B2

(12) United States Patent  (10) Patent No.: US 8,779,860 B2
Jeon et al.  (45) Date of Patent: Jul. 15, 2014

(54) POWER AMPLIFIER (75) Inventors: Moon Suk Jeon, Seoul (KR); Jung Rin Woo, Seoul (KR); Sang Hwa Jung, Ansan (KR); Jung Hyun Kim, Uiwang (KR); Young Kwon, Thousand Oaks, CA (US)

(73) Assignee: Avago Technologies General IP (Singapore) Ptd. Ltd., Singapore (SG)

( * ) Notice: Subject to any disclaimer, the term of this patent is extended or adjusted under 35 U.S.C. 154(b) by 3 days.

(21) Appl. No.: 13/586,218

(22) Filed: Aug. 15, 2012

(65) Prior Publication Data

US 2014/0049322 A1  Feb. 20, 2014

(51) Int. Cl.
*H03F 1/22* (2006.01)

(52) U.S. Cl.
USPC .......................................................... 330/311

(58) Field of Classification Search
USPC .................................. 330/277, 296, 302, 311
See application file for complete search history.

(56) References Cited

U.S. PATENT DOCUMENTS

| 7,164,321 | B2 | 1/2007 | Behzad |
| 7,248,120 | B2 * | 7/2007 | Burgener et al. ............. 330/311 |
| 7,276,968 | B2 | 10/2007 | Ozawa et al. |
| 7,714,664 | B2 * | 5/2010 | Kanaya et al. ................ 330/311 |
| 7,839,213 | B2 | 11/2010 | de Graauw et al. |
| 8,111,104 | B2 * | 2/2012 | Ahadian et al. ............... 330/311 |
| 8,228,125 | B2 * | 7/2012 | Heijden et al. ................ 330/311 |
| 2010/0056080 | A1 | 3/2010 | Sato |
| 2011/0031953 | A1 | 2/2011 | Kanbe et al. |

OTHER PUBLICATIONS

Cijvat, et al. "A GaN HEMT Power Amplifier with Variable Gate Bias for Envelope and Phase Signals", Dept. of Electrical and Information Technology, Lund University, Sweden, IEEE Norchip Conference, 2007.

* cited by examiner

*Primary Examiner* — Khanh V Nguyen (57) ABSTRACT

A power amplifier comprises a common source amplification stage and a first common gate amplification stage. The common source amplification stage includes a common source transistor for receiving a radio frequency (RF) input signal via a gate. The first common gate amplification stage is connected in cascode between a variable supply voltage source and the common source amplification stage, and amplifies an output of the common source amplification stage. The first common gate amplification stage includes a first common gate transistor, and a first gate bias controller configured to generate a first divided voltage based on a variable supply voltage of the variable supply voltage source, and to supply a first gate bias voltage generated by buffering the first divided voltage to a gate of the first common gate transistor.

15 Claims, 6 Drawing Sheets

POWER AMPLIFIER

BACKGROUND

In an effort to integrate an entire transceiver system used in a communication system into a single integrated circuit (IC), a complementary metal-oxide semiconductor (CMOS) power amplifier is being widely used. The CMOS power amplifier generally employs a plurality of CMOS transistors in a cascode configuration. The CMOS transistors of the CMOS cascode power often share a high drain voltage swing and, therefore, problems resulting from junction breakdown of the CMOS transistors can be ameliorated.

Furthermore, in an effort to improve efficiency of a radio frequency (RF) power amplifier, a supply-voltage modulated power amplifier, such as an envelope tracking power amplifier or an envelope elimination and restoration power amplifier, is being used.

Figure 1:
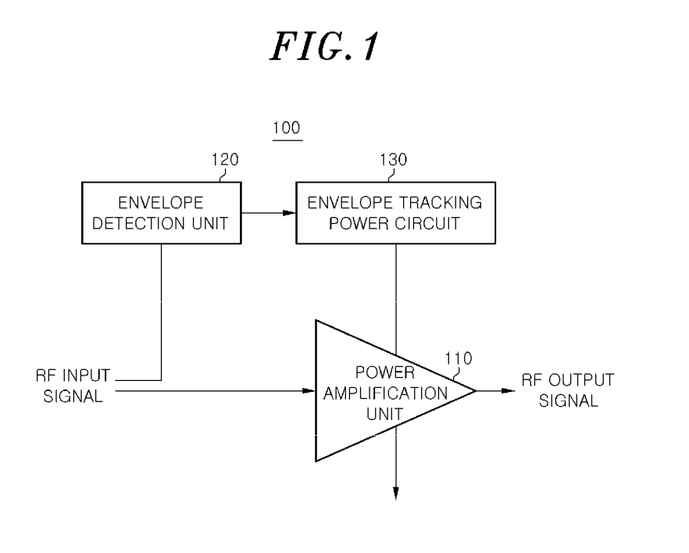
FIG. 1 is a diagram illustrating an example of a known supply-voltage modulated power amplifier.

FIG. 1 is a simplified schematic diagram of a known supply-voltage modulated power amplifier 100. The supply-voltage modulated power amplifier 100 of FIG. 1 includes a power amplification unit 110 for amplifying an RF input signal, an envelope detection unit 120 for detecting an envelope of the RF input signal, and an envelope tracking power circuit 130 for supplying the RF power amplification unit 110 with a modulated, supply voltage based on a change in the envelope over time. As such, the known supply-voltage modulated power amplifier 100 is not operated by a fixed supply voltage, but is operated by a modulated supply voltage based on an envelope of the RF input signal, that is, a variable supply voltage, as a drive power.

However, there are several problems in applying the known supply-voltage modulated power amplifier to the above-described CMOS cascode power amplifier. Notably, when the CMOS cascode power amplifier is operated by a variable supply voltage, it is difficult to maintain a gate voltage of each of a plurality of cascode transistors at an optimum gate bias point thereof. Specifically, in the CMOS cascode power amplifier, each of the cascode transistors has an optimum gate bias point that enables the CMOS cascode power amplifier to operate at an optimum efficiency. Further, the optimum gate bias point varies in proportion to the supply voltage. However, bias networks, such as a resistive divider and a current mirror, which are generally used to bias gate voltages of a known CMOS cascode power amplifier, cannot render the gate voltage of each of the cascode transistors to the optimum gate bias point when the supply voltage varies. The reason for this is that a voltage coupling from a drain of each of the cascode transistors to a gate thereof, which results from the variable supply voltage, changes a gate bias point of each of the cascode transistors rendered by said bias networks. It is difficult to predict the amount of the voltage coupling because it significantly varies with a size of the cascode transistor and a layout of the CMOS cascode power amplifier.

Moreover, the efficiency of the CMOS cascode power amplifier may significantly deteriorate at a low supply voltage. Specifically, the efficiency of the supply-voltage modulated power amplifier tends to deteriorate under low-supply voltage conditions because of a "knee" voltage and a non-linear gate-to-drain capacitance. Meanwhile, the knee voltage in the CMOS cascode power amplifier is higher than that in other devices, increasing in proportion to the number of cascode transistors. Furthermore, when the supply voltage decreases, the gate-drain capacitance increases, and consequently, an optimum load impedance may vary. In case of the CMOS cascode power amplifier, a variation amount of the optimum load impedance tends to increase in proportion to the number of cascode transistors, and therefore, the efficiency of the CMOS cascode power amplifier may further decrease.

As a result, in order to improve the efficiency of the supply-voltage modulated CMOS cascode power amplifier, it is necessary to maintain a gate bias of each of the cascode transistors at an optimum gate bias point thereof and to suppress increases of a knee voltage and a non-linear gate-to-drain capacitance at a low supply voltage even when using a variable supply voltage as a drive power.

What is needed, therefore, is a power amplifier that overcomes at least the shortcomings of known power amplifiers described above.

BRIEF DESCRIPTION OF THE DRAWINGS

The above and other objects and features of the present invention will become apparent from the following description of representative embodiments given in conjunction with the accompanying drawings, in which.

DETAILED DESCRIPTION

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

Hereinafter, representative embodiments of the present teachings will be described in detail below with reference to the accompanying drawings.

The present teachings are directed to an improvement of an efficiency of a supply-voltage modulated cascode power amplifier. More specifically, by using gate bias controllers connected to common gate transistors, power amplifiers in accordance with the present teachings can set each gate bias to an optimum bias point when a time-varying supply voltage is applied, and sequentially short cascode transistors as the supply voltage decreases, thereby preventing the efficiency from deteriorating even when the supply voltage decreases.

Figure 2:
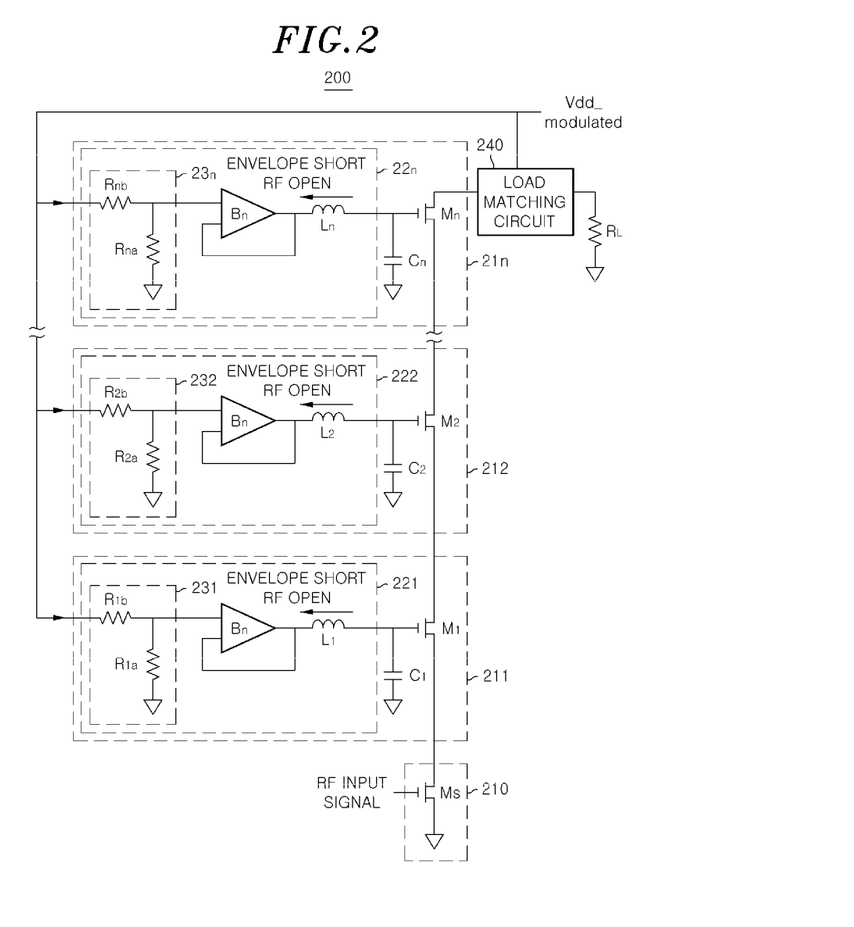
FIG. 2 is a circuit diagram showing a power amplifier in accordance with a representative embodiment.

FIG. 2 is a circuit diagram showing a power amplifier 200 in accordance with a representative embodiment, Referring to FIG. 2, the power amplifier 200 in accordance with this representative embodiment includes a common source amplification stage 210 and n common gate amplification stages 211, 212, ..., and 21n. The n common gate amplification stages 211, 212, ..., and 21n include a first common gate amplification stage 211, a second common gate amplification stage 212, ..., and an n-th common gate amplification stage 21n. Here, n is an integer that is equal to or greater than 1. The case in which n=1 corresponds to a two-stage cascode amplifier. The power amplifier 200 may further include a load, matching circuit 240 and a load resistor $R_L$.

The common source amplification stage 210 includes a common source transistor $M_s$ configured to receive a Radio Frequency (RF) input signal via a gate of the common source transistor $M_s$.

The first common gate amplification stage 211 is connected in cascode between a variable supply voltage source supplying a variable supply voltage Vdd_modulated and the common source amplification stage 210, and amplifies an output of the common source amplification stage 210. More specifically, the first common gate amplification stage 211 may include a first common gate transistor $M_1$, a first gate bias controller 221, and a first RF short capacitor $C_1$. The variable supply voltage Vdd_modulated may be determined based on an envelope signal of the RF input signal so that the power amplifier 200 can operate as a supply-voltage modulated amplifier. Common gate transistors $M_1, M_2, \ldots,$ and $M_n$ may be Complementary Metal Oxide Semiconductor Field Effect Transistors (CMOSFETs) or other types of transistors.

The first gate bias controller 221 generates a first divided voltage based on the variable supply voltage Vdd_modulated, generates a first gate bias voltage by buffering the first divided voltage, and supplies the first gate bias voltage to the gate of the first common gate transistor $M_1$. More specifically, the first gate bias controller 221 may include a first voltage divider circuit 231, a first unity-gain buffer $B_1$, and a first inductor $L_1$.

The first voltage divider circuit 231 is connected between the variable supply voltage source supplying the variable supply voltage Vdd_modulated and the first unity-gain buffer $B_1$, and outputs the first divided voltage, i.e., a voltage at a node between the two resistors $R_{1a}$ and $R_{1b}$, based on the ratio between the resistance values of two resistors $R_{1a}$ and $R_{1b}$. The ratio between the two resistors $R_{1a}$ and $R_{1b}$ may be determined such that the first divided voltage becomes an optimum bias voltage of the gate of the first common gate transistor $M_1$.

The first unity-gain buffer $B_1$ may be connected between the first voltage divider circuit 231 and the first inductor $L_1$. More specifically, an input terminal of the first unity-gain buffer $B_1$ may be connected to an output terminal of the first voltage divider circuit 231, and an output terminal of the first unity-gain buffer $B_1$ may be connected to the gate of the first common gate transistor $M_1$ via the first inductor $L_1$. The first unity-gain buffer $B_1$ receives the first divided voltage from the first voltage divider circuit 231, and provides a first gate bias voltage identical to the first divided voltage to the gate of the first common gate transistor $M_1$. Since the first gate bias controller 221 has an output impedance almost close to 0 at an envelope frequency due to the first unity-gain buffer $B_1$, the first gate bias controller 221 can prevent a bias disturbance attributable to envelope coupling that occurs when a conventional resistive divider bias circuit is used. Accordingly, when the variable supply voltage Vdd_modulated varying over time is applied, the first gate bias controller 221 may adjust a gate voltage of the first common gate transistor $M_1$ to a voltage required for an optimum efficiency.

The first inductor $L_1$ may be connected between the first unity-gain buffer $B_1$ and the gate of the first common gate transistor $M_1$. The first inductor $L_1$ is used to prevent the first gate bias controller 221 from interrupting the RF performance of the power amplifier 200. Further, since the first inductor $L_1$ has an impedance of almost 0 at the envelope frequency, the first inductor $L_1$ rarely affects an operation of the first gate bias controller 221.

Although a unity-gain buffer is used in this embodiment, a buffer whose gain is not 1 may also be used in some embodiments.

The second common gate amplification stage 212 is connected in cascode between the variable supply voltage source supplying the variable supply voltage Vdd_modulated and the first common gate amplification stage 211, and amplifies an output of the first common gate amplification stage 211. The second common gate amplification stage 212 may include a second common gate transistor $M_2$, a second gate bias controller 222, and a first RF short capacitor $C_2$. Further, the second gate bias controller 222 may include a second voltage divider circuit 232 based on a ratio between resistance values of two resistors $R_{2a}$ and $R_{2b}$, a second unity-gain buffer $B_2$, and a second inductor $L_2$.

In the same manner, the n-th common gate amplification stage 21n may include an n-th common gate transistor $M_n$, an n-th gate bias controller 22n, and an n-th RF short capacitor $C_n$. Furthermore, the n-th gate bias controller 22n may include an n-th voltage divider circuit 23n based on a ratio between resistance values of two resistors $R_{2n}$ and $R_{2n}$, an n-th unity-gain buffer $B_n$, and an n-th inductor $L_n$.

Configurations and operations of the second common gate amplification stage 212 to the n-th common gate amplification stage 21n are similar to those of the above-described first common gate amplification stage 211.

Accordingly, the power amplifier 200 in accordance with this representative embodiment may dynamically adjust the gate voltage of each of the common gate transistors $M_1, M_2, \ldots,$ and $M_n$ to a voltage required for an optimum efficiency when the time-varying variable supply voltage Vdd_modulated is applied.

Meanwhile, as described above, it is necessary to prevent an efficiency of a power amplifier from deteriorating when a supply voltage of the power amplifier decreases. In accordance with the present teachings, as the supply voltage decreases, cascode transistors are sequentially shorted, thereby overcoming the above problem. This will now be described in detail with reference to FIGS. 3A and 3B.

Figure 3A:
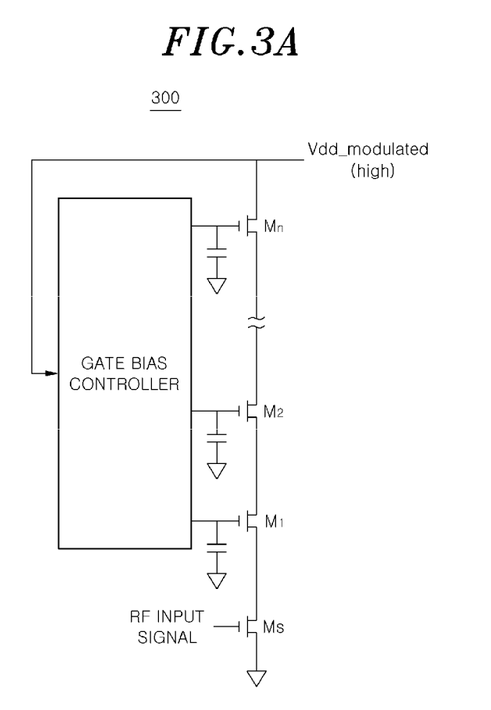
FIGS. 3A and 3B are diagrams showing an operation of a power amplifier in accordance with another representative embodiment.
Figure 3B:
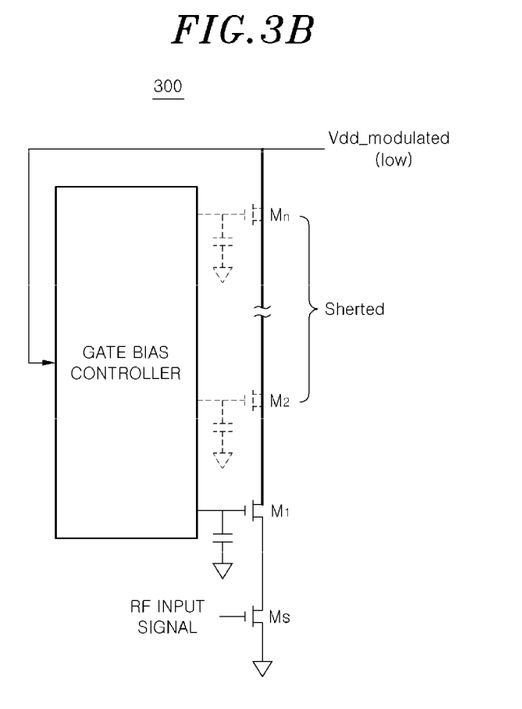

FIGS. 3A and 3B are diagrams showing an operation of a power amplifier 300 in accordance with another representative embodiment.

Specifically, FIG. 3A shows an operation of the power amplifier 300 when a variable supply voltage Vdd_modulated is sufficiently high. In this case, all common gate transistors $M_1, M_2, \ldots,$ and $M_n$ normally operate in saturated regions. That is a gate bias controller biases each gate of the common gate transistors $M_1, M_2, \ldots,$ and $M_n$ with a voltage that allows the power amplifier 300 to achieve an optimum efficiency.

FIG. 3B shows an operation of the power amplifier 300 when the variable supply voltage Vdd_modulated is low. When the variable supply voltage Vdd_modulated is low, the gate bias controller shorts some or all of the common gate transistors $M_1, M_2, \ldots,$ and $M_n$ depending on an amplitude of the variable supply voltage Vdd_modulated. The number of common gate transistors to be shorted is inversely proportional to the amplitude of the variable supply voltage Vdd_modulated. The reason for this is to suppress a reduction in efficiency attributable to a knee voltage and a nonlinear gate-drain capacitance that increase in proportion to the number of common gate transistors.

The detailed reason for this will now be described. Assuming that the knee voltage of each transistor is V and the number of cascode transistors within the power amplifier is N, the equivalent knee voltage of the power amplifier is N*V. When a supply voltage is high, the ratio of N*V to the supply voltage is negligible. Accordingly, in this case, the knee voltage does not greatly affect the overall efficiency of the power amplifier. In contrast, when the supply voltage is low, the ratio of N*V to the supply voltage is no longer negligible, and, therefore, the influence of an equivalent knee voltage N*V should be taken into consideration. Therefore, the gate bias controller in accordance with a representative embodiment can reduce the equivalent knee voltage by shorting at least one common gate transistor. For example, if N−2 common gate transistors are shorted, the equivalent knee voltage is reduced from N*V to 2 V. Furthermore, when the common gate transistors are sequentially shorted as the supply voltage decreases, the nonlinear gate-drain capacitance does not increase by a large amount. The reason for this is that the non-linear gate-drain capacitance is related to a drain-source voltage of each transistor and the drain-source voltage can be maintained when the transistor is shorted. For example, when a supply voltage of 4 V is supplied to a cascode power amplifier including four transistors, a drain-source voltage of each of the four transistors is 1 V. Meanwhile, when the supply voltage is reduced to 2 V and the upper two transistors are shorted, the drain-source voltage of each of the lower two transistors becomes 1 V. This is equal to a value that is obtained when the supply voltage is 4 V. Accordingly, since the gate-drain capacitance does not change by a large amount with respect to any supply voltage, the load, impedance does not change by a large amount, so that the efficiency of the power amplifier can be kept high.

In FIG. 3B, the remaining common gate transistors $M_2$ to $M_n$ other than the first common gate transistor $M_1$ are shorted. This means that the variable supply voltage Vdd_modulated of FIG. 3B is very low. In FIG. 3B, the transistors $M_2$ to $M_n$ are shorted, so that an increase in an equivalent knee voltage and a nonlinear gate-drain capacitance of the power amplifier 300 attributable to the transistors $M_2$ to $M_n$ can be suppressed, and therefore, the deterioration in the efficiency of the power amplifier 300 can be prevented. Meanwhile, even when the transistors $M_2$ to $M_n$ are shorted, the power amplifier 300 does not break down. The reason for this is that an output voltage swing also decreases.

A method of sequentially shorting common gate transistors as the variable supply voltage Vdd_modulated decreases will be described below with reference to FIG. 4.

Figure 4:
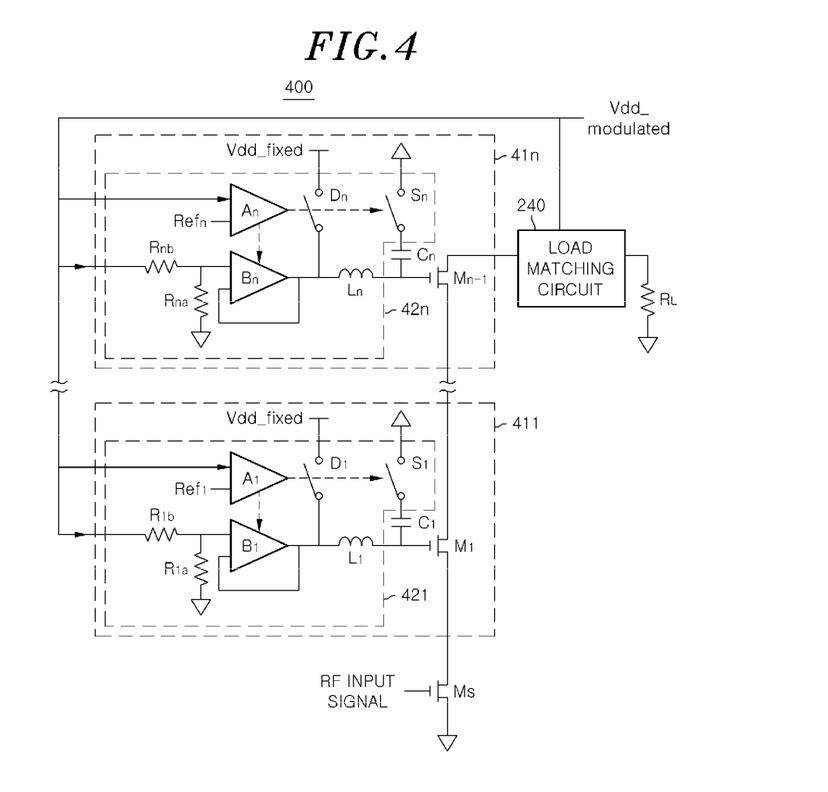
FIG. 4 is a diagram showing a detailed configuration of the power amplifier of FIGS. 3A and 3B.

FIG. 4 is a diagram showing the detailed configuration of the power amplifier 300 of FIGS. 3A and 3B.

Although the power amplifier 400 of FIG. 4 is basically similar to the power amplifier 200 of FIG. 2, they are different from each other in that each of the gate bias controllers 421 to 42n of common gate amplification stages 411 to 41n further includes each of fixed supply voltage switches $D_1$ to $D_n$, each of comparators $A_1$ to $A_n$ and each of capacitor floating switches $S_1$ to $S_n$ and common gate transistors are shorted using the above components. The operating principles of the common gate amplification stages 411 to 41n are the same as each other, and the operation of the n-th common gate amplification stage 41n will be described below as an example.

In the n-th common gate amplification stage 41n, the n-th gate bias controller 42n shorts an n-th common gate transistor $M_n$ if the variable supply voltage Vdd_modulated is lower than an n-th reference voltage $Ref_n$. More specifically, the n-th comparator $A_n$ compares the n-th reference voltage $Ref_n$ with the variable supply voltage Vdd_modulated. If the variable supply voltage Vdd_modulated is lower than the n-th reference voltage $Ref_n$, the n-th comparator $A_n$ shorts the n-th common gate transistor $M_n$ by turning on the n-th fixed supply voltage switch $D_n$ connected between an output of the n-th unity-gain buffer $B_n$ and a fixed supply voltage source supplying a fixed supply voltage Vdd_fixed. That is, the n-th comparator $A_n$ rapidly increases the gate bias voltage of the n-th common gate transistor $M_n$ into the fixed supply voltage Vdd_fixed.

Further, if the modulated supply voltage Vdd_modulated is lower than the n-th reference voltage $Ref_n$, the n-th comparator $A_n$ cuts off a power supply to the n-th unity-gain buffer $B_n$. Accordingly, a waste of current flowing to the n-th unity-gain buffer $B_n$ can be reduced.

Furthermore, if the modulated supply voltage Vdd_modulated is lower than the n-th reference voltage $Ref_n$, the n-th comparator $A_n$ turns off the n-th capacitor floating switch $S_n$ connected between the n-th RF short capacitor $C_n$ and a grounded node in order to float the n-th RF short capacitor $C_n$. The reason for this is to prevent the deterioration of the efficiency of the power amplifier 400 due to an unnecessary shift of a load impedance by the n-th RF short capacitor $C_n$, because the n-th RF short capacitor $C_n$ and a gate-source capacitor of the n-th common gate transistor $M_n$ act as series-connected, shunt capacitors when the capacitor floating switch $S_n$ is turned on.

Accordingly, when the modulated supply voltage Vdd_modulated is lower than the n-th reference voltage $Ref_n$, the n-th common gate transistor $M_n$ is almost shorted while having a low on-resistance. Accordingly, as the n-th common gate transistor $M_n$ is shorted, the knee voltage of the power amplifier 400 decreases, and therefore, the efficiency of the power amplifier 400 can be improved.

In contrast, when the modulated supply voltage Vdd_modulated is higher than the first reference voltage $Ref_n$, it is apparent that the n-th comparator $A_n$ turns off the n-th fixed supply voltage switch $D_n$, does not cut off the power supply to the n-th unity-gain buffer $B_n$, and turns on the n-th capacitor floating switch $S_n$.

In the same manner, when the modulated supply voltage Vdd_modulated is lower than the first reference voltage $Ref_n$, the first gate bias controller 421 may short the first common gate transistor $M_1$. The remaining common gate transistors not shown in the drawing are shorted if the variable supply voltage Vdd_modulated is lower than a reference voltage of each of the remaining common gate transistors.

In this embodiment, the reference voltages $Ref_1$ to $Ref_n$ have a relationship $Ref_1 < \ldots < Ref_n$ so that from the n-th common gate controller 42n, that is, the uppermost transistor, to the first common gate controller 421 can be sequentially shorted as the variable supply voltage Vdd_modulated decreases. That is, as the variable supply voltage Vdd_modulated decreases, a larger number of common gate transistors become shorted. In some other embodiment, it will be apparent that the reference voltages $Ref_1$ to $Ref_n$ may have a different relationship.

Figure 5:
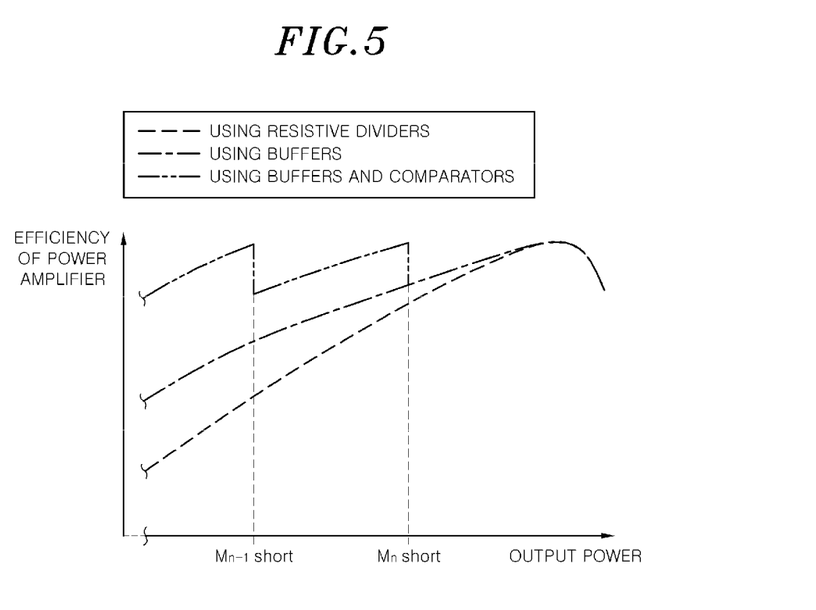
FIG. 5 is a graph comparing the efficiencies versus output powers of a known power amplifier with the power amplifiers in accordance with certain representative embodiments.

FIG. 5 is a graph showing efficiencies against output powers of a conventional power amplifier and the power amplifiers in accordance with the representative embodiments.

Referring to FIG. 5, the efficiency of the power amplifier in the case in which only a resistive divider is used for gate biasing decreases more rapidly than in the other two cases. The reason for this is that an interruption attributable to envelope coupling occurs when each gate of the cascode transistors is biased, and therefore it is difficult for each gate bias of the cascoded transistors to be adjusted to the optimum bias point.

In the case of using the buffer for gate biasing, that is, in the case of the embodiment of FIG. 2, the efficiency of the power amplifier at an intermediate power level is improved compared to the efficiency in the case in which only the resistive divider is used. The reason for this is that each gate of the cascoded transistors can be biased to the optimum bias point without the interruption attributable to envelope coupling because of the buffer connected to each gate of the cascoded transistors.

In the case of using not only the buffer but also the comparator for gate biasing, that is, in the case of the embodiment of FIG. 4, the efficiency of the power amplifier is further improved. The reason for this is that whenever the variable supply voltage Vdd_modulated decreases below each of predetermined values, the gate bias controller sequentially shorts the common gate transistors, thereby decreasing the knee voltage and also suppressing an increase in the nonlinear gate-drain capacitance.

Although with regard to the power amplifiers in accordance with the representative embodiments, the descriptions have been given using a limited number of transistors and limited types of devices for convenience of description, it should be appreciated that a larger number of transistors or some other type of transistors may be included and operated within the scope and technical spirit of the present invention.

The representative embodiments are contemplated for use in an RF power amplification device and a communication device and system using the RF power amplification device. In particular, the representative embodiments can be applied, to a power amplification device using a CMOS transistor, and wireless systems, such as a cellular handset, a mobile Internet device, or a wireless personal digital assistant (PDA), including the power amplification device.

Moreover, the representative embodiments described herein can be implemented in communication systems using communication methods requiring high linearity, such as High Speed Downlink Packet Access (HSDPA), High Speed Uplink Packet Access (HSUPA), enhanced data rates for GSM evolution (EDGE), long term evolution/4 G (LIE), WiFi, world-wide interoperability for microwave access (WiMax), code division multiple access (CDMA), and wideband-code division multiple access (WCDMA).

In accordance with representative embodiments, a power amplifier is described. One of ordinary skill in the art would appreciate that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

What is claimed is:

1. A power amplifier, comprising:
a common source amplification stage including a common source transistor configured to receive a radio frequency (RF) input signal via a gate of the common source transistor; and
a first common gate amplification stage connected in cascode between a variable supply voltage source and the common source amplification stage, and configured to amplify an output of the common source amplification stage,
wherein the first common gate amplification stage includes:
a first common gate transistor connected in cascode to the common source transistor; and
a first gate bias controller configured to generate a first divided voltage based on a variable supply voltage of the variable supply voltage source, to generate a first gate bias voltage by buffering the first divided voltage, and to supply the first gate bias voltage to a gate of the first common gate transistor.

2. The power amplifier of claim 1, wherein the first gate bias controller shorts the first common gate transistor when the variable supply voltage is lower than a first reference voltage.

3. The power amplifier of claim 1, wherein the first gate bias controller includes:
a first voltage divider circuit connected to the variable supply voltage source, and configured to output the first divided voltage; and
a first unity-gain buffer including an input terminal connected to an output terminal of the first voltage divider circuit and an output terminal connected to the gate of the first common gate transistor, and configured to output the first gate bias voltage.

4. The power amplifier of claim 3, wherein the first gate bias controller further includes a first inductor connected between the first unity-gain buffer and the gate of the first common gate transistor.

5. The power amplifier of claim 3, wherein the first gate bias controller includes:
a first fixed supply voltage switch connected between the output terminal of the first unity-gain buffer and a fixed supply voltage source; and
a first comparator configured to compare the first reference voltage with the variable supply voltage, and to short the first common gate transistor by turning on the first fixed supply voltage switch when the variable supply voltage is lower than the first reference voltage.

6. The power amplifier of claim 5, wherein the first comparator cuts off a power supply to the first unity-gain buffer when the variable supply voltage is lower than the first reference voltage.

7. The power amplifier of claim 5, wherein the first comparator floats a first RF short capacitor connected between the gate of the first common gate transistor and a grounded node when the variable supply voltage is lower than the first reference voltage.

8. The power amplifier of claim 1, further comprising a second common gate amplification stage connected in cascode between the variable supply voltage source and the first common gate amplification stage,
wherein the second common gate amplification stage includes:
a second common gate transistor connected in cascode to the first common gate transistor; and a second gate bias controller configured to generate a second divided voltage based on the variable supply voltage, to generate a second gate bias voltage by buffering the second divided voltage, and to supply the second gate bias voltage to a gate of the second common gate transistor.

9. The power amplifier of claim 8, wherein the second gate bias controller shorts the second common gate transistor when the variable supply voltage is lower than a second reference voltage.

10. The power amplifier of claim 9, wherein the first gate bias controller shorts the first common gate transistor if the variable supply voltage is lower than a first reference voltage, and the first reference voltage is lower than the second reference voltage.

11. The power amplifier of claim 5, wherein the second gate bias controller includes:
    a second voltage divider circuit connected to the variable supply voltage source, and configured to output the second divided voltage; and
    a second unity-gain buffer including an input terminal connected to an output terminal of the second voltage divider circuit and an output terminal connected to the gate of the second transistor, and configured to output the second gate bias voltage.

12. The power amplifier of claim 1, wherein the second gate bias controller further includes:
    a second fixed supply voltage switch connected between the output terminal of the second unity-gain buffer and a fixed supply voltage source; and
    a second comparator configured to compare the second reference voltage with the variable supply voltage, and to short the second common gate transistor by turning on the second fixed supply voltage switch when the variable supply voltage is lower than the second reference voltage.

13. The power amplifier of claim 12, wherein the second comparator cuts off a power supply to the second unity-gain buffer when the variable supply voltage is lower than the second reference voltage.

14. The power amplifier of claim 12, wherein the second comparator floats a second RF short capacitor connected between the gate of the second common gate transistor and a grounded node when the variable supply voltage is lower than the second reference voltage.

15. The power amplifier of claim 1, wherein the variable supply voltage is determined based on an envelope signal of the RF input signal.

* * * * *